(12) United States Patent
Wang

(10) Patent No.: US 7,215,016 B2
(45) Date of Patent: May 8, 2007

(54) MULTI-CHIPS STACKED PACKAGE

(75) Inventor: Sung-Fei Wang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 278 days.

(21) Appl. No.: 10/747,114

(22) Filed: Dec. 30, 2003

(65) Prior Publication Data
US 2004/0184250 A1   Sep. 23, 2004

(30) Foreign Application Priority Data
Mar. 21, 2003   (TW) ............................. 92106424 A

(51) Int. Cl.
*H01L 23/48* (2006.01)
*H01L 23/49* (2006.01)

(52) U.S. Cl. .................. 257/686; 257/723; 257/778; 257/784; 361/767; 361/783

(58) Field of Classification Search ............... 438/109
See application file for complete search history.

(56) References Cited

U.S. PATENT DOCUMENTS 6,319,829 B1 *  11/2001  Pasco et al. ............... 438/678
6,351,028 B1 *   2/2002  Akram ...................... 257/686
6,407,456 B1 *   6/2002  Ball ......................... 257/777
6,555,902 B2 *   4/2003  Lo et al. ................... 257/686
6,650,006 B2 *  11/2003  Huang et al. .............. 257/686
6,861,288 B2 *   3/2005  Shim et al. ................ 438/109
2004/0238857 A1 * 12/2004  Beroz et al. ............... 257/232

* cited by examiner

Primary Examiner—John B. Vigushin
(74) Attorney, Agent, or Firm—Bacon & Thomas, PLLC

(57) ABSTRACT

A multi-chips stacked package mainly comprises a substrate, a first lower chip, a second lower chip, an upper chip and a carrier. The substrate has an upper surface, and the first lower chip and the second lower chip are disposed on the upper surface of the substrate and electrically connected to the substrate. The carrier is disposed on and electrically connected to the first lower chip and the second lower chip simultaneously, and the upper chip is mounted on the carrier. Moreover, the upper chip is electrically connected to the substrate through the carrier, the first lower chip or the second lower chip.

6 Claims, 5 Drawing Sheets

MULTI-CHIPS STACKED PACKAGE

BACKGROUND OF THE INVENTION

1. Field of Invention

This invention relates to a multi-chips stacked package. More particularly, the present invention is related to a multi-chips stacked package having a carrier for carrying the upper chip for preventing the upper chip from being directly disposed on the lower chip.

2. Related Art

Recently, integrated circuit (chip) packaging technology is becoming a limiting factor for the development in packaged integrated circuits of higher performance. Semiconductor package designers are struggling to keep pace with the increase in pin count, size limitations, low profile, and other evolving requirements for packaging and mounting integrated circuits.

Due to the assembly package in miniature and the integrated circuits operation in high frequency, MCM (multi-chips module) packages are commonly used in said assembly packages and electronic devices. Usually, said MCM package mainly comprises at least two chips encapsulated therein, for example a processor unit, a memory unit and related logic units, so as to upgrade the electrical performance of said assembly package. In addition, the electrical paths between the chips in said MCM package are short so as to reduce the signal delay and save the reading and writing time.

Generally speaking, conventional MCM packages shall be a multi-chips side-by-side package or a multi-chips stacked package. As shown in FIG. 1, it illustrates a multi-chips stacked package and said stacked package is formed by disposing upper chips 12 and 13 on a lower chip 14 by wire-bonding and chip-stacking technology, electrically connecting the upper chips 12 and 13 to a substrate 16 respectively and electrically connecting the upper chips 12 and 13 with each other via the electrically conductive wires 18. However, the upper chip 12 is partially disposed on the lower chip 14 and overhangs over the lower chip 14. Similarly, the upper chip 13 is also partially disposed on the lower chip 14 and overhangs over the lower chip 14. Thus, the upper chips 12 and 13 will be damaged and cracked more easily in the operation of the wire-bonging process. Referring to FIG. 2, lower chips 22 and 23 are disposed on the substrate 26, and the upper chip 24 is mounted on the lower chips 22 and 23 simultaneously so that the upper chip 24 can be supported firmly by the lower chips 22 and 23 and the substrate 26, and prevented from being damaged and cracked.

As mentioned above, however, there are several disadvantages as following shown. When the lower chips 22 and 23 are adjacent to each other and connect with each other, the lower chip 22 will be pressed against the lower chip 23 due to thermal expansion. Thus, in order to prevent the above-mentioned problem, the lower chips 22 and 23 shall be apart from each other in a distance. However, when the distance between the lower chips 22 and 23 is larger than 50 µm, the portion 242 of the lower surface of the upper chip 24 not supported by the lower chips 22 and 23 will be damaged easily in the performance of the wire-bonding process.

Therefore, providing another assembly package to solve the mentioned-above disadvantages is the most important task in this invention.

SUMMARY OF THE INVENTION

In view of the above-mentioned problems, an objective of this invention is to provide a multi-chips stacked package to improve the reliability of the wire-bonding process and prevent the upper chip from being easily damaged and cracked. Therein, a carrier is provided on the lower chips to carry the upper chip so as to prevent the upper chip from being directly disposed on the lower chips and to solve the above-mentioned disadvantage.

To achieve the above-mentioned objective, a multi-chips stacked package is provided, wherein the multi-chips stacked package mainly comprises a substrate, an upper chip, a first lower chip, a second lower chip and a carrier. Therein, the substrate has an upper surface for disposing the first lower chip and the second lower chip, and the lower chips are electrically connected to the substrate respectively. Said carrier is disposed on the first lower chip and the second lower chip, and the upper chip is mounted on the carrier and electrically connected to the carrier via a plurality of electrically conductive wires.

As mentioned above, the carrier may be a printed circuits board (PCB). Generally speaking, the carrier comprises a core layer and a copper layer. Therein the copper layer can be a circuit layer and is regarded as electrical paths for transmitting electrical signals. The core layer can be made of Bismaleimide-Triazine (BT) or glass epoxy resins (FR-4) so that the carrier is able to bear the wire-bonding force by the stiffness of the core layer in the performance of the wire-bonding process. Thus, the upper chip can be prevented from damaging.

BRIEF DESCRIPTION OF THE DRAWINGS

The invention will become more fully understood from the detailed description given herein below illustrations only, and thus are not limitative of the present invention, and wherein.

DETAILED DESCRIPTION OF THE INVENTION

The multi-chips stacked package according to the preferred embodiment of this invention will be described herein below with reference to the accompanying drawings, wherein the same reference numbers refer to the same elements.

Figure 1:
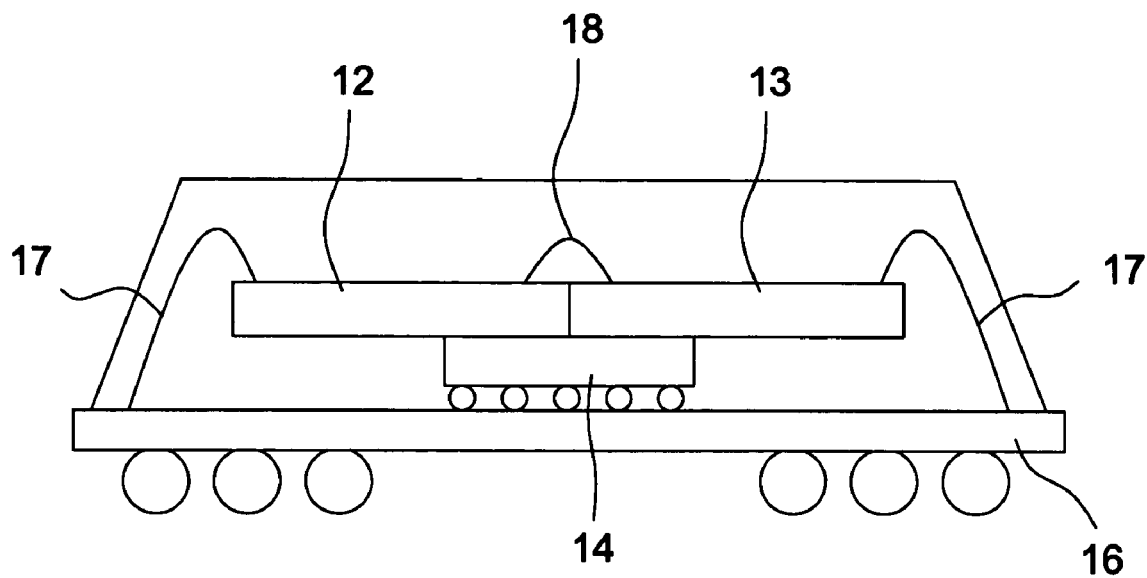
FIG. 1 is a cross-sectional view of the conventional multi-chips stacked package.
Figure 2:
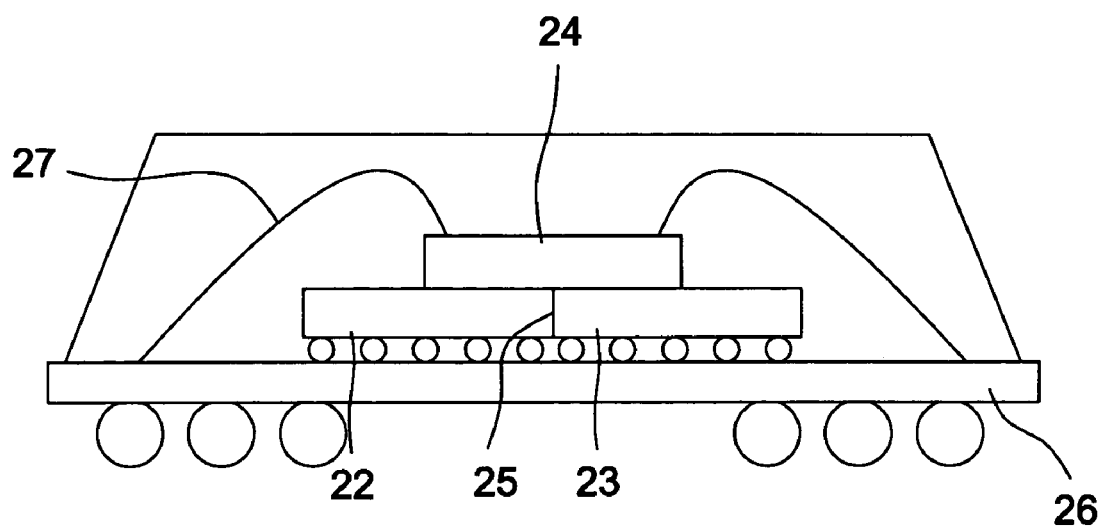
FIG. 2 is a cross-sectional view of another conventional multi-chips stacked package.
Figure 3:
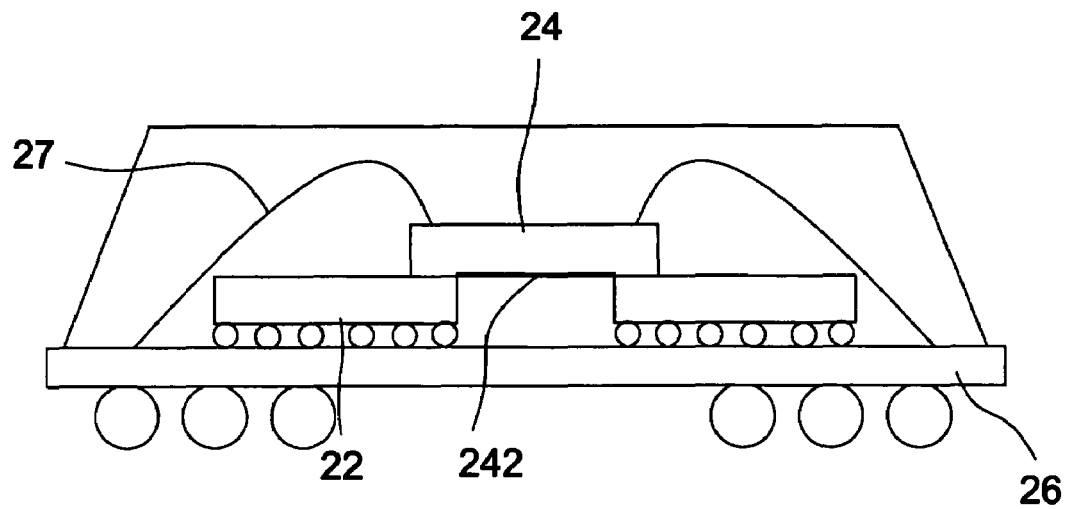
FIG. 3 is a cross-sectional view of another conventional multi-chips stacked package.
Figure 4:
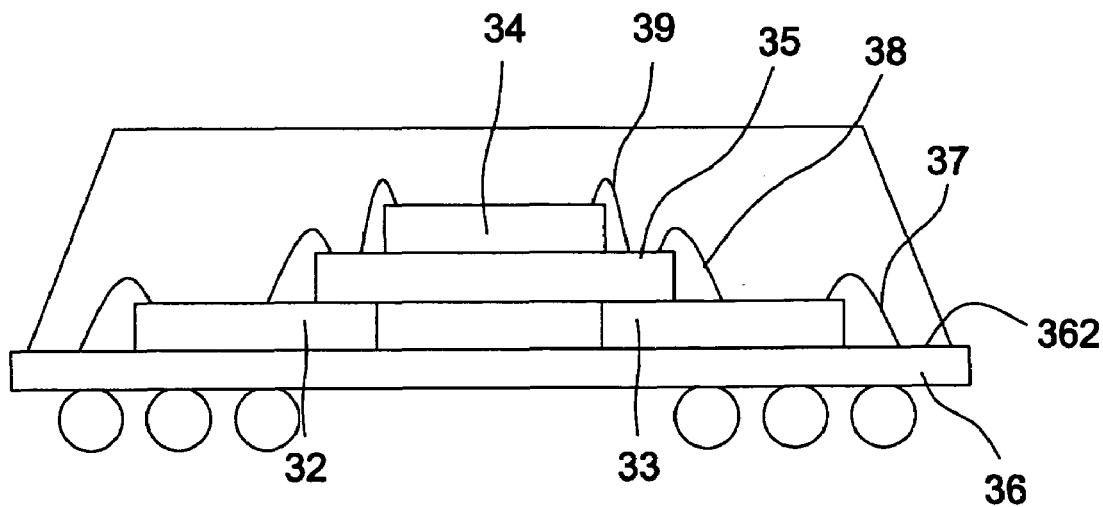
FIG. 4 is a cross-sectional view of a multi-chips stacked package according to the first embodiment.

In accordance with a first preferred embodiment as shown in FIG. 4, there is provided a multi-chips stacked package.

The multi-chips stacked package mainly comprises a first lower chip 32, a second lower chip 33, an upper chip 34 and a carrier 35 and a substrate 36. Therein, the substrate 36 has an upper surface 362, and the first lower chip 32 and the second lower chip 33 are disposed on the upper surface 362 of the substrate 36 and electrically connected to the substrate 36 respectively. In addition, the carrier 35 is disposed on the first lower chip 32 and the second lower chip 33 simultaneously and carries the upper chip 34, and electrically connected to the carrier 35 via the electrically conductive wires 39. Besides, the carrier 35 is electrically connected to the first lower chip 32 and the second lower chip 33 through the electrically conductive wires 38 respectively.

Figure 5:
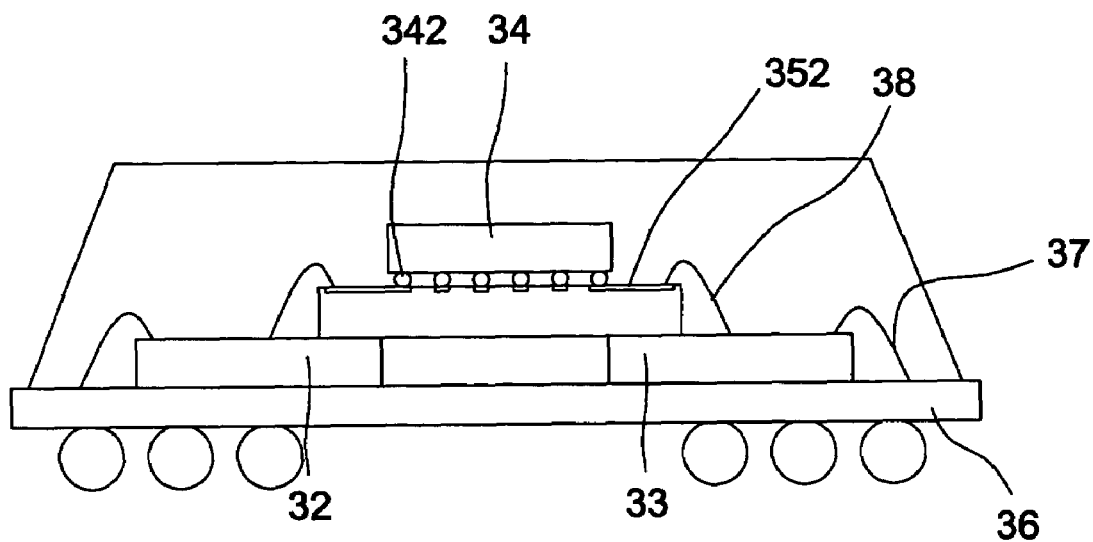
FIG. 5 is a cross-sectional view of a multi-chips stacked package according to the second embodiment.

Besides, as shown in FIG. 5, it illustrates a second embodiment in according to this invention. The upper chip 34 is mounted on the carrier 35 via a plurality of electrically conductive bumps 342, for example solder bumps and gold bumps. In addition, the carrier 35 further has a circuit layer 352 for electrically connecting to the electrically conductive bumps 342. Thus, the upper chip 34 is electrically connected to the first lower chip 32 and the second lower chip 33 through the electrically conductive bumps 342, the circuit layer 352 and the electrically conductive wires 38.

Figure 6:
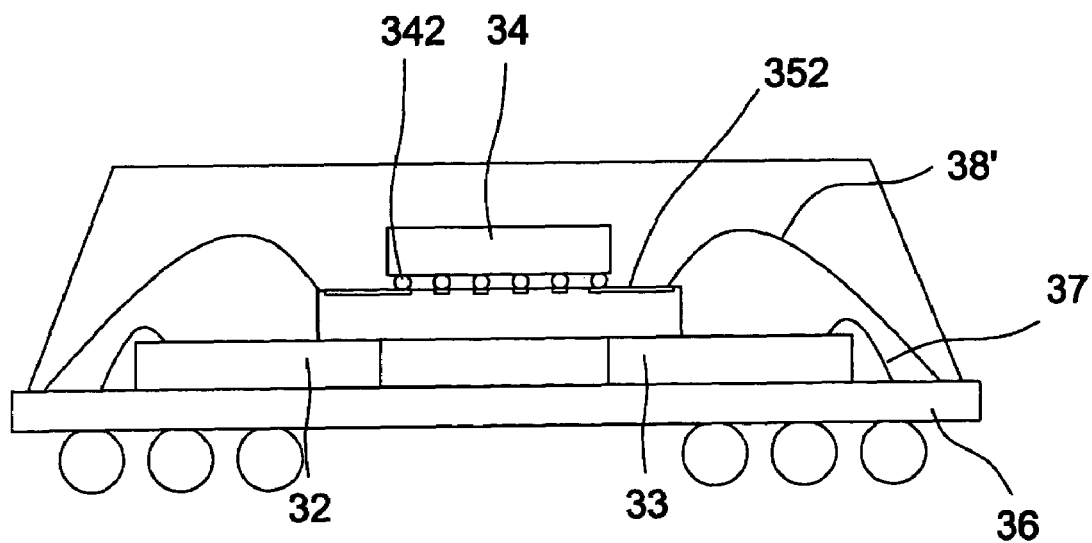
FIG. 6 is a cross-sectional view of a multi-chips stacked package according to the third embodiment.

Furthermore, as shown in FIG. 6, it illustrates a third preferred embodiment according to this invention. The upper chip 34 is electrically connected to the carrier 35 via a plurality of electrically conductive bumps 342 and the upper chip 34 is electrically connected to the substrate 36 through the electrically conductive bumps 342, the circuit layer 352 and electrically conductive wires 38'.

Figure 7:
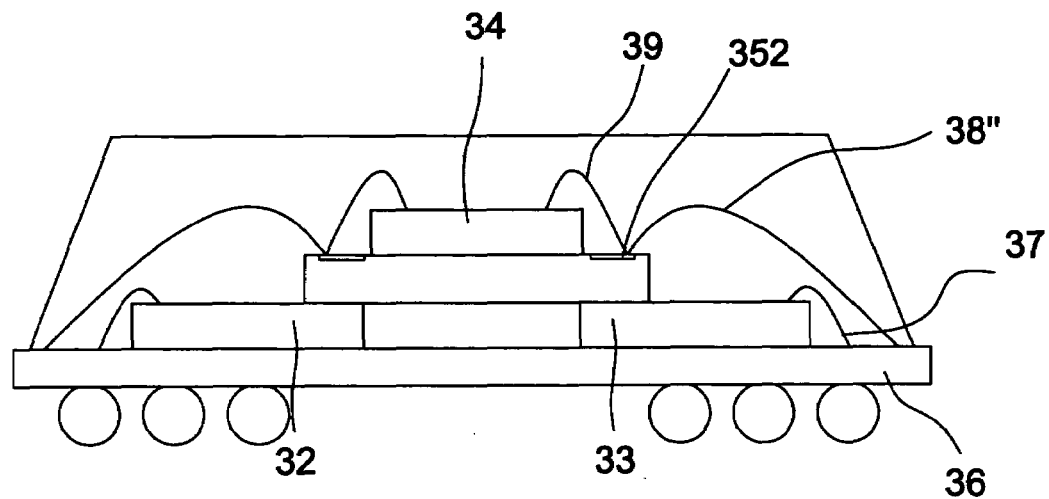
FIG. 7 is a cross-sectional view of a multi-chips stacked package according to the fourth embodiment.

Next, as shown in FIG. 7, it illustrates a fourth embodiment. The upper chip 34 is electrically connected to the carrier 35 via a plurality of electrically conductive wires 39 by wire-bonding technology. Similarly, the carrier 35 further comprises a circuit layer 352 so as to have the upper chip 34 electrically connected to the substrate 36 through the electrically conductive wires 39, the circuit layer 352 and another electrically conductive wires 38".

As mentioned above, said carrier 35 can be a printed circuit board. Generally speaking, it is composed of a core layer and a copper layer. Therein, the copper layer is patterned to form a circuit layer to be electrical paths and the core layer is formed of a material selected from Bismaleimide-Triazine (BT) and glass epoxy resins (FR4) so that the carrier 35 is able to bear the wire-bonding force by the stiffness of the core layer in the performance of the wire bonding process. Thus, the upper chip 34 can be prevented from being damaged. It should be noted that the reference numeral of each element shown in FIGS. 5, 6, and 7 are corresponding the reference one provided in FIG. 4.

Figure 8:
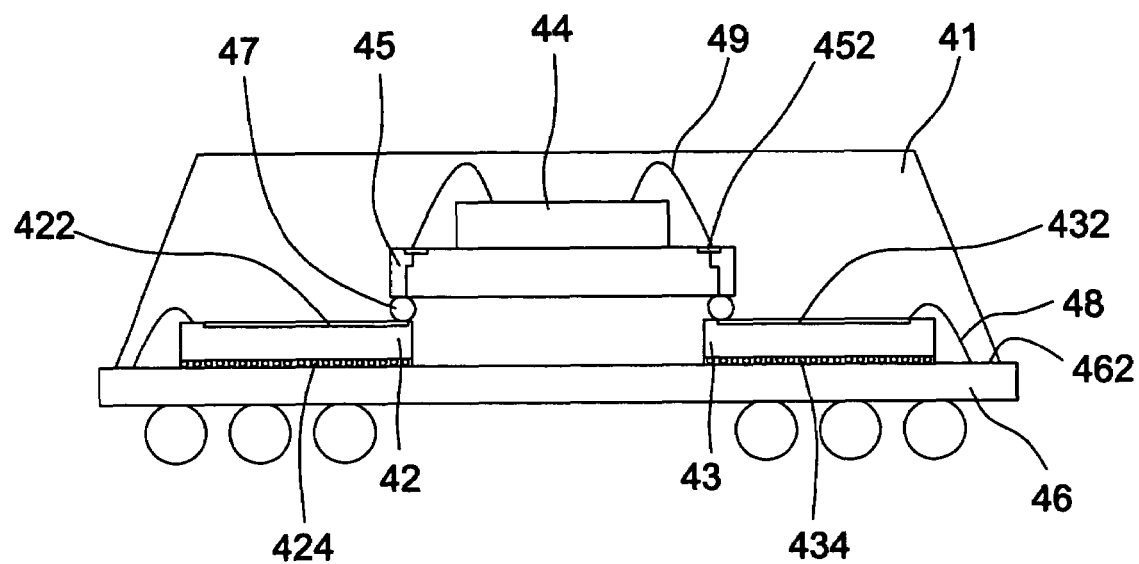
FIG. 8 is a cross-sectional view of a multi-chips stacked package according to the fifth embodiment.

Next, referring to FIG. 8, a fifth preferred embodiment is provided. The first lower chip 42 and the second lower chip 43 are disposed on the upper surface 462 of the substrate 46 and are electrically connected to the substrate 46 via electrically conductive bumps 424 and 434 respectively. The carrier 45 is disposed on the first lower chip 42 and the second lower chip 43 simultaneously, and is electrically connected to the first lower chip 42 and the second lower chip 43 through electrically conductive bumps 47, a circuit layer 452, electrically conductive wires 49 and redistributed layers 422 and 432 formed on the back surface of the chip 42 and 43. In addition, there is further provided an encapsulation 41 enclosing the first lower chip 42, the second lower chip 43 and the upper chip 44 so as to prevent the chips 42, 43 and 44 from being moisturized.

Figure 9:
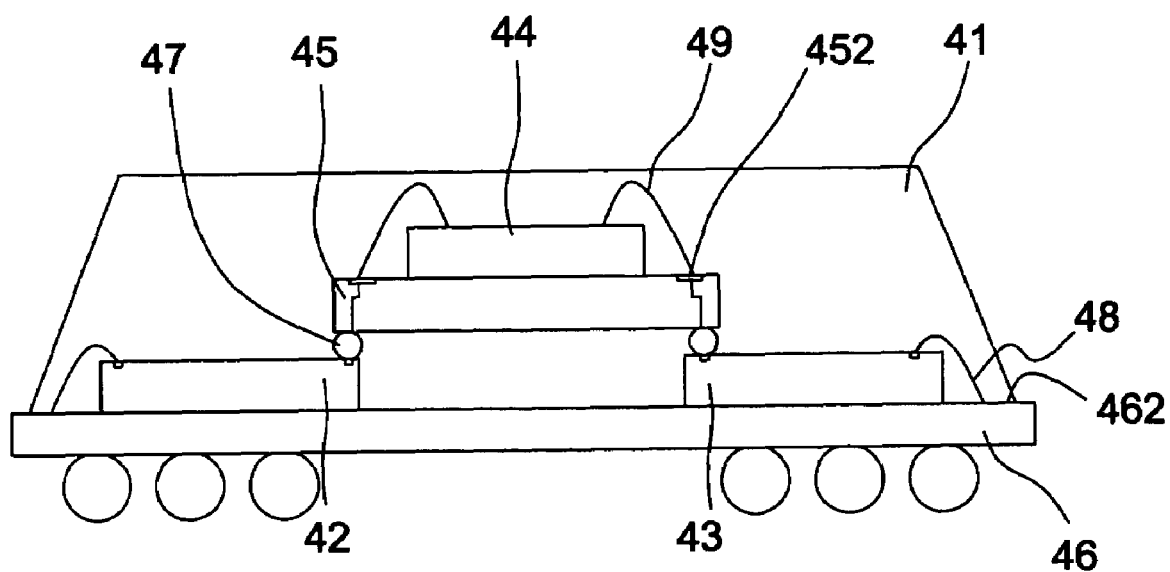
FIG. 9 is a cross-sectional view of a multi-chips stacked package according to the sixth embodiment.

Finally, referring to FIG. 9, there is provided a sixth embodiment. Said first lower chip 42 and said second lower chip 43 are disposed on the upper surface 462 of the substrate 46, and electrically connected to the substrate 46 via electrically conductive wires 48. In addition, the carrier 45 is disposed on the first lower chip 42 and the second lower chip 43 simultaneously, and electrically connected to the first lower chip 42 and the second lower chip 43 through electrically conductive bumps 47. Moreover, the upper chip 44 is disposed on the carrier 45 and electrically connected to the first lower chip 42 and the second lower chip 43 through electrically conductive wires 49, a circuit layer 452, a plurality of electrically conductive bumps 47. After the electrical signals are transmitted from the upper chip 44 to the first lower chip 42 and the second lower chip 43, the signals will be transmitted to the substrate 46 through electrically conductive wires 48. It should be noted that the reference numeral of each element shown in FIG. 9 are corresponding the reference one provided in FIG. 8. Specifically, the substrate as mentioned above can also be replaced by a lead-frame. Accordingly, said package can be mounted to a motherboard by surface mount technology (SMT) without any further solder balls formed on the lower surface of the lead-frame.

In summary, according to this invention, the upper chip is not directly disposed on the first lower chip and the second lower chip with a portion not supported by the first lower chip and the second lower chip. Namely, the upper chip does not overhang the first lower chip and the second lower chip due to the carrier entirely carrying the upper chip. Accordingly, when the first lower chip is apart from the second chip with a distance more than 50 μm, the carrier can prevent the upper chip from being damaged and cracked in the performance of the electrically conductive wires bonding the upper chip to the substrate. In addition, the carrier may be designed to dispose across the first lower chip and the second lower chip so as to carry the upper chip above the lower chips. Consequently, the length of the diagonal of the upper surface or the lower surface of the upper chip may less than said distance as shown above.

Although the invention has been described in considerable detail with reference to certain preferred embodiments, it will be appreciated and understood that various changes and modifications may be made without departing from the spirit and scope of the invention as defined in the appended claims.

The invention claimed is:

1. A multi-chips stacked package, comprising:
   a substrate having an upper surface and a lower surface;
   a first lower chip disposed on the upper surface of the substrate and electrically connected to the substrate;
   a second lower chip disposed on the upper surface of the substrate and electrically connected to the substrate;
   a carrier disposed on the first lower chip and the second lower chip simultaneously; and
   an upper chip disposed on the carrier and electrically connected to the carrier;
   wherein the carrier comprises a core layer and a circuit layer and the circuit layer of the carrier is electrically connected to the first lower chip through an electrically conductive wire.

2. A multi-chips stacked package, comprising:
   a substrate having an upper surface and a lower surface;
   a first lower chip disposed on the upper surface of the substrate and electrically connected to the substrate;
   a second lower chip disposed on the upper surface of the substrate and electrically connected to the substrate;
   a carrier disposed on the first lower chip and the second lower chip simultaneously; and an upper chip disposed on the carrier and electrically connected to the carrier;

wherein the carrier comprises a core layer and a circuit layer and the circuit layer of the carrier is electrically connected to the second lower chip through an electrically conductive wire.

3. The multi-chips stacked package of claim 2, wherein the first lower chip further comprises a first back surface with a redistributed layer electrically connecting to the carrier through an electrically conductive bump.

4. The multi-chips stacked package of claim 3, wherein the redistributed layer formed on the first back surface is electrically connected to the substrate through a plurality of electrically conductive wires.

5. The multi-chips stacked package of claim 2, wherein the first lower chip is electrically connected to the substrate through an electrically conductive wire and electrically connected to the carrier through an electrically conductive bump.

6. A multi-chips stacked package, comprising:
a substrate having an upper surface and a lower surface;
a first lower chip disposed on the upper surface of the substrate and electrically connected to the substrate;
a second lower chip disposed on the upper surface of the substrate and electrically connected to the substrate;
a carrier disposed on the first lower chip and the second lower chip simultaneously; and
an upper chip disposed on the carrier and electrically connected to the carrier;
wherein the carrier comprises a core layer and a circuit layer and the circuit layer of the carrier is electrically connected to the first lower chip or the second lower chip through an electrically conductive bump.

* * * * *